US011482850B2

(12) United States Patent
Miklis et al.

(10) Patent No.: US 11,482,850 B2
(45) Date of Patent: Oct. 25, 2022

(54) METHOD FOR DETECTING ACCIDENTAL ARCS DURING THE CHARGING OF ELECTRICAL BATTERY SYSTEMS

(71) Applicant: Ellenberger & Poensgen GmbH, Altdorf (DE)

(72) Inventors: Markus Miklis, Pfeifferhuette (DE); Thomas Regahl, Lauf (DE); Christian Strobl, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 337 days.

(21) Appl. No.: 16/778,756

(22) Filed: Jan. 31, 2020

(65) Prior Publication Data

US 2020/0177003 A1 Jun. 4, 2020

Related U.S. Application Data

(63) Continuation of application No. PCT/EP2018/067135, filed on Jun. 26, 2018.

(30) Foreign Application Priority Data

Jul. 31, 2017 (DE) ..................... 10 2017 213 174.8

(51) Int. Cl.
*H02H 1/00* (2006.01)
*H01M 10/12* (2006.01)
(Continued)

(52) U.S. Cl.
CPC ........... *H02H 1/0015* (2013.01); *B60L 53/14* (2019.02); *G01R 31/52* (2020.01); *H01M 10/12* (2013.01); *H02J 7/0029* (2013.01); *H02J 7/0031* (2013.01)

(58) Field of Classification Search
CPC ........ H02H 1/0015; H02H 3/38; H02H 3/445; H02H 7/18; B60L 53/14; B60L 3/00;
(Continued)

(56) References Cited

U.S. PATENT DOCUMENTS 6,661,197 B2 * 12/2003 Zink ..................... H02J 7/0042 320/108
7,697,247 B2 * 4/2010 Maharsi ................. H01H 9/542 361/13

(Continued)

FOREIGN PATENT DOCUMENTS

CN 2899130 Y 5/2007
DE 102011106297 A1 1/2012

(Continued)

OTHER PUBLICATIONS

International Search Report dated Oct. 1, 2018 in corresponding application PCT/EP2018/067135.

(Continued)

*Primary Examiner* — Giovanni Astacio-Oquendo
(74) *Attorney, Agent, or Firm* — Muncy, Geissler, Olds & Lowe, P.C.

(57) ABSTRACT

A method for detecting arc faults when charging electric battery systems or lead acid batteries, which are electrically connected in series to form a string which is supplied via a DC voltage converter. A first value corresponding to an electric voltage applied to the string and a second value corresponding to an electric current flowing through the string are generated. As a first condition, it is checked whether the first value changes by more than a first limit value within a first time window. As the second condition, it is checked whether the second value changes by more than a second limit value within a second time window. An arc is detected if the first condition and the second condition are met within a third time window. Provided also is a method (Continued)

for manufacturing electric battery systems, in particular lead acid batteries, as well as to a cut-off device.

12 Claims, 2 Drawing Sheets

(51) Int. Cl.
*H02J 7/00* (2006.01)
*B60L 53/14* (2019.01)
*G01R 31/52* (2020.01)

(58) Field of Classification Search
CPC .. B60L 3/0046; B60L 58/10; B60L 2240/547; B60L 2240/549; B60L 3/0069; B60L 3/04; G01R 31/52; G01R 31/392; G01R 31/3842; H01M 10/12; H02J 7/0029; H02J 7/0031; H02J 7/00718; H02J 7/02; Y02E 60/10; Y02P 70/50; Y02T 10/70; Y02T 10/7072; Y02T 90/14
USPC ......................................... 324/536, 512, 500
See application file for complete search history.

(56) References Cited

U.S. PATENT DOCUMENTS

| | | | |
|---|---|---|---|
| 8,179,147 | B2 | 5/2012 | Dargatz et al. |
| 8,649,139 | B2 | 2/2014 | Roscoe et al. |
| 9,478,967 | B2 | 10/2016 | Dargatz et al. |
| 10,069,314 | B2 | 9/2018 | Dulle |
| 10,148,102 | B2 | 12/2018 | Dulle et al. |
| 10,411,484 | B2 | 9/2019 | Dulle et al. |
| 10,498,150 | B2 | 12/2019 | Dulle et al. |
| 10,601,233 | B2 | 3/2020 | Tosch et al. |
| 2014/0028116 | A1* | 1/2014 | O'Brien ................... H02H 3/04 307/130 |
| 2017/0126036 | A1 | 5/2017 | Dulle |
| 2020/0022552 | A1* | 1/2020 | Han ...................... A47L 9/2889 |
| 2020/0122655 | A1* | 4/2020 | Kim ...................... B60L 3/0046 |
| 2020/0254882 | A1* | 8/2020 | Kwon ................... H02J 7/0031 |

FOREIGN PATENT DOCUMENTS

| | | | |
|---|---|---|---|
| DE | 102012020718 | A1 | 4/2014 |
| EP | 2916455 | A1 | 9/2015 |
| JP | 2011007765 | A | 1/2011 |
| JP | 2012044861 | A | 3/2012 |
| JP | 2013500476 | A | 1/2013 |
| WO | WO2017079041 | A1 | 5/2017 |

OTHER PUBLICATIONS

Japanese Decision to Grant a Patent dated Apr. 6, 2021 in corresponding application 2020-503961.

Notice of Allowance for Chinese Application No. 201880049309.6 dated Feb. 23, 2022 with partial English translation.

* cited by examiner

METHOD FOR DETECTING ACCIDENTAL ARCS DURING THE CHARGING OF ELECTRICAL BATTERY SYSTEMS

This nonprovisional application is a continuation of International Application No. PCT/EP2018/067135, which was filed on Jun. 26, 2018, and which claims priority to German Patent Application No. 10 2017 213 174.8, which was filed in Germany on Jul. 31, 2017, and which are both herein incorporated by reference.

BACKGROUND OF THE INVENTION

Field of the Invention

The present invention relates to a method for the detection of arc faults when charging electric battery systems. A lead acid battery is preferably used in each case as the battery system. The invention further relates to a method for manufacturing electric battery systems and to a cut-off device.

Description of the Background Art

Generally, lead acid batteries are used as car batteries. In these, typically six or twelve battery cells are connected in series, each having 2 V. Each cell has two lead electrodes arranged in a dilute sulfuric acid, which serves as an electrolyte. In the uncharged state, a layer of lead (II) sulfate is deposited on the two electrodes. In the charged state, one of the two electrodes, namely the positive electrode, has a layer of lead (IV) oxide, whereas the negatively polarized electrode essentially is formed of porous lead. To avoid a short circuit between the usually relatively closely arranged electrodes, a separator is disposed between these, for example, of a perforated, corrugated polyvinyl chloride (PVC).

After mechanical production, it is necessary to charge the lead acid batteries, since these are mostly used as starter batteries in the automotive industry and the motor vehicle is to be immediately ready for use after exchanging the starter battery. For this purpose, it is necessary that during manufacture, an electric voltage is applied to the lead acid batteries for a certain period of time and these are thus charged. For a large number of lead acid batteries to be manufactured in a comparatively short period of time, these are usually connected in series and contacted with an electric voltage source. For this, it is necessary that, on the one hand, the lead acid batteries are electrically contacted with one another. This is usually done by loosely placing connecting cables, comparatively simple clamps or the like on the individual terminals of the lead acid batteries. However, it is also possible here that the connection is lost between one of the cables and the associated terminal, for example, due to contamination or improper assembly. Because of the applied electric voltage, an arc over which the electric current continues to flow may form between these components. In other words, in this way, the charging process is not interrupted.

Due to the application of the electric voltage, the sulfuric acid serving as the electrolyte is dissociated, and at least partially hydrogen is formed, which mixes with oxygen and thus forms oxyhydrogen. This is usually retained within the housing of the respective lead acid battery. However, it is also possible that due to manufacturing tolerances, a comparatively large amount of oxyhydrogen is formed. In this case, to avoid a bursting of the lead acid battery housing, housing valves are opened on account of the excess pressure so that the oxyhydrogen can escape. Here, it is possible that such an oxyhydrogen cloud may move into the range of an arc. Due to the spark provided by the arc, in particular the plasma and the comparatively high temperature of this plasma, ignition of the oxyhydrogen cloud can occur. This can cause damage to the equipment for manufacturing the lead acid batteries and to the lead acid batteries disposed therein, as well as possible injury to any persons present.

A charging system for batteries is known from US 2017/0126036 A1. WO 2017/079041 A1 also discloses a battery system by means of which errors in charging can be identified.

SUMMARY OF THE INVENTION

It is therefore an object of the present invention to improve the charging of electric battery systems, wherein in particular risk of explosion is reduced and/or safety is increased.

In an exemplary embodiment, the method is used to detect arc faults, that is, in particular the formation of a plasma between two electrically charged parts, wherein by means of the plasma, a current flow is created or maintained between the two electrically charged parts. For the formation of such arc faults ("ARC"), an electric voltage that is greater than a minimum voltage is required. This minimum voltage, for example, is dependent on contact material, a current intensity and/or an air temperature. In particular, the minimum voltage is essentially equal to 15 volts.

By means of the method, arc faults occurring during the charging electric battery systems are detected. The battery systems are electrically connected in series to form a string. The string itself is supplied by means of a DC voltage converter. In this way, an energy flow takes place from the DC voltage converter to the string. As a result, the string at least partially, preferably completely, forms the load, and the DC voltage converter forms at least partially, preferably completely, the source. In other words, by means of the DC voltage converter, an electric DC voltage is always applied to the string, which is expediently substantially constant. For example, several strings, each with an associated controller and in particular identical to one another, are connected in parallel to one another. The string comprises at least two battery systems, preferably between 5 battery systems and 50 battery systems, in particular between 10 battery systems and 30 battery systems, and for example equal to 15 battery systems.

In particular, each battery system has an electrolyte and/or each battery system is electrochemical. The electrolyte of each battery system is particularly aqueous and/or in an aqueous solution. A battery system with aqueous electrolyte is expediently used for each battery system. For example, each battery system has a number of electrochemical cells that are suitably connected. Suitably, the battery systems are identical in construction. The battery systems are, for example, accumulators and therefore rechargeable. In particular, the battery systems are open systems. In other words, for example, when the battery system is being charged, a certain chemical substance emerges or is absorbed, for example, from the ambient air, such as in particular air, oxygen or hydrogen. Preferably preferred, the battery system is a lead acid battery, such as a so-called starter battery for a motor vehicle. For example, the battery system, in particular the lead acid battery, has an electric voltage of 12 volts or 24 volts in the charged state (nominal voltage values). For charging the electric battery system, a charging profile is suitably used, which includes a current and/or voltage control in phases. In particular, an electric voltage (charging voltage) of up to 2.4 volts is applied per potential cell of the battery systems, for example up to 13.8 volts or 14.8 volts per battery system. Due to the series connection, it is therefore necessary that by means of the DC voltage converter, a multiple of this charging voltage is provided, wherein the multiple corresponds to the number of battery systems per string.

For example, the battery systems are charged by regulating an electric voltage applied to the string or regulating an electric current flowing through the electric string. For example, first the electric current flowing through the string is regulated. If the battery systems are charged to a certain degree, in particular a change is made to regulating the electric voltage applied to the battery systems and thus to the string.

The method provides that in one step, a first value corresponding to an electric voltage applied to the string is generated. For example, the electric voltage applied to the string is directly used as a first value. Alternatively, the first value is generated using the electric voltage. For example, the first value is calculated on the basis of the electric voltage or calculated on the basis of a characteristic map. At least, however, the first value is a function of the applied electric voltage. In a further step, which takes place chronologically, for example, before or after the first step, a second value is generated that corresponds to the electric current flowing through the string. The first value and the second value are suitably generated essentially simultaneously. The first value is preferably based on the electric voltage which is applied when the electric current flows, on the basis of which the second value is generated. For example, the electric current is used directly as a second value or the second value is generated on the basis of the electric current or calculated from a map. In particular, the electric voltage or the electric current is suitably measured, in particular directly, to obtain the first and the second value.

As a first condition, the first value is checked in a further step as to whether it changes by more than a first limit value within a first time window. Change is understood to mean, for example, an increase or a decrease. In particular, it is only checked as to whether the first value increases by more than the first limit value. It is preferably checked as to whether the electric voltage, on the basis of which the first value is generated, increases by a certain value, which corresponds to the first limit value, within the first time window or within a time period corresponding to the first time window. The check for the first condition is preferably carried out essentially continuously as long as the string is supplied by means of the DC voltage converter.

Furthermore, in a second condition, it is checked as to whether the second value changes by more than a second limit value within a second time window. Change can mean, for example, an increase or a decrease. Suitably, it is only checked as to whether the second value decreases by more than the second limit. Preferably, it is checked as to whether within a time period corresponding to the second time window, the electric power, on the basis of which the second value is generated, decreases by more than a certain value which corresponds to the second limit value. In summary, it is therefore implicitly checked in particular as to whether the electric voltage applied to the string increases within a certain period of time, and whether the electric current drops within a further period of time. For example, the existence of the second condition is checked essentially continuously, at least as long as the string is fed by means of the DC voltage converter. Alternatively, only the presence of the second condition is checked if the first condition is met.

Suitably, to determine whether the first value or the second value change by more than the first or second limit value, the derivative of the time course of the first value or the second value is generated, respectively, which simplifies a check for the two conditions. The arc is detected if the first condition and the second condition exist within a third time window. For example, the arc is only detected when the second condition occurs after the first condition has occurred. Suitably, the second condition is only checked if the first condition exists.

In summary, it is thus checked in particular as to whether the electric voltage applied to the string rises, and the electric current flowing through the string decreases. If the arc occurs, the latter is, for example, formed between an electric contact of one of the battery systems and a cable or the like connecting the battery systems, so that the arc is connected in series with the battery systems. Because of the arc and due to (replacement) capacity that supplies the individual battery systems, as well components of the DC voltage converter and further components such as in particular a transformer supplying the DC voltage converter, the electric voltage occurring across the complete string rises and the electric current drops. After a certain settling and readjustment phase, which in particular is larger than the first, second and third time windows, a normalization of the electric voltage and the electric current, which is applied to the string or flows through this, is carried out.

Due to the detection of the arc, it is possible to disable, for example, the DC voltage converter or to isolate the string from the DC voltage converter or at least electrically interrupt the latter, so that the arc is extinguished. Thus, any loose electrical connections are recognized relatively quickly, so that the arc can be switched off before any explosive gases, which are created during charging of the battery systems, enter the range of the arc/loose connection. Therefore, when charging the battery systems, the risk of explosion is reduced and thus safety increased. Also, burn-off or at least deformation of a pole of the respective battery system due to an existing arc during charging and the increased temperature, is prevented. This also means that there is less waste when charging the battery systems. Because of the check for the two conditions, the method is relatively robust and independent of the number of occurring arcs and substantially their respective temporal duration. In particular, the method of detecting arcs is carried out only when a first charge of the battery systems, which in particular are rechargeable battery systems such as lead acid batteries, has taken place. Alternatively, the method for detecting arcs is executed when a recharging of the battery systems takes place that have already been charged at least once.

The first value can be generated by averaging the electric voltage applied to the string over a fourth time window. In other words, the electric voltage that is applied to the string during the fourth time window is detected. During the fourth time window, the electric voltage is calculated multiple times, in particular more than twice, more than five times or more than ten times. For example, the electric voltage is calculated continuously or, for example, as a function of further processing, which is suitably carried out digitally. In particular, the calculation is matched to a possible A/D converter, for example, to its sampling rate. For example, the electric voltage is newly calculated respectively every microsecond, every other microsecond, every fifth microsecond, every tenth microsecond, every twentieth microsecond, every fiftieth microsecond or every hundredth microsecond. In particular, the arithmetic mean value is used for averaging, so that first, the sum of values for the applied electric voltage is formed and is divided by the number of values (measured values). Suitably, if a new value is calculated for the electric voltage, i.e., in particular every 10 microseconds, the first value is generated anew. The values of the electric voltage calculated during the fourth time window are averaged and this value is used as the first value, for example. In other words, the mean value itself is used as the first value. Particularly preferably, however, the derivative of the time course of the mean derivative, calculated approximately in particular by means of numerical calculation, is used as the first value and is compared with the first limit value.

Alternatively, or more preferably in combination with this, the second value is generated by averaging over a fifth time window of the electric current flowing through the string. Here, during the fifth time window, conveniently the electric current is repeatedly recorded, for example measured, and these values (measured values) are used for averaging. The electric current is calculated several times during the fifth time window, in particular more than twice, more than five times or more than ten times. For example, the electric current is continuously calculated (recorded) or, for example, as a function of further processing, which is suitably carried out digitally. In particular, the calculation is matched to a possible A/D converter, for example to its sampling rate. The arithmetic mean is suitably generated. For example, the mean value itself is used as the second value. In particular, however, the derivative of the time course of the mean value is preferably used as the second value and compared with the second limit value.

In particular, to determine the first or second value, in each case between 100 values and 400 values, for example, 300 measured values, are employed. The length of the fourth time window is preferably equal to the length of the fifth time window, which simplifies processing. Due to the averaging, temporary current or voltage peaks are smoothed, preventing faulty identification of arcs. In addition, any fluctuations in the supply voltage of the DC voltage converter are taken into account. As an alternative to averaging, for example, the maximum or the minimum of the electric voltage applied during the fourth time window or the electric current flowing during the fifth may be used.

A moving average is suitably formed in each case, so that if further measured values are provided, older measured values are no longer used for averaging. Appropriately, the length of the fourth and/or fifth time window is constant. In particular, each time a new measured value for the electric voltage or for the electric current exists, the first or second value is calculated anew. For the calculation, a so-called FIFO memory ("first in first out") is used, for example, simplifying calculation. Here, only the particular values are stored in the memory, which are used for averaging, and by means of which the first or second value is thus generated. For example, for averaging, a fraction of a value to be deleted from the memory is subtracted from an already established mean value and a fraction of a new value to be stored is added thereto.

In particular, the length of the fourth time window is equal to the reciprocal of the product of twice the number of phases of the DC voltage converter and a supply frequency of the DC voltage converter. In other words, initially twice the number of phases is calculated, by means of which the DC voltage converter is operated. For example, the DC voltage converter is connected to a three-phase AC mains. In this case, the number of phases equals three ("3"). Twice the number of phases corresponds in particular to the number of partial bridges of the DC voltage converter. If the latter in particular has a bridge circuit, which is constructed, for example, as a B6 circuit and thus has six semiconductors, then twice the number of the phases equals six ("6"). If the DC voltage converter is connected to a single-phase AC mains, twice equals two ("2").

The supply frequency is the frequency that each of the individual phases of the DC voltage converter has, for example 50 Hz or 60 Hz. In the case of a three-phase DC voltage converter whose supply frequency is 60 Hz, the length of the fourth time window is therefore $\frac{1}{360}$ s, i.e. approx. 2.8 ms. In a three-phase DC voltage converter, of which the supply frequency is 50 Hz, the length of the fourth time window is thus $\frac{1}{300}$ s, or approx. 3.3 ms. Alternatively, an integer multiple thereof is used. In other words, the length of the fourth time window corresponds to double, triple, quadruple, . . . the reciprocal. Thus, the length of the fourth time window is equal to a multiple of the reciprocal value, that is, the simple, double, triple, . . . of the reciprocal. Due to the length of the fourth time window and the averaging for calculating the first value, fluctuations in the electric voltage caused by the AC voltage by means of which the DC voltage converter is operated are essentially completely smoothed out. Thus, erroneous identification of the arc is avoided.

Alternatively, or particularly preferably in combination herewith, the length of the fifth time window is equal to the reciprocal of the product of twice the number of phases of the DC voltage converter and of a supply frequency of the DC voltage converter, or in integer multiples thereof. In particular, the length of the fifth time window is thus $\frac{1}{360}$ s, $\frac{2}{360}$ s, $\frac{3}{360}$ s, $\frac{4}{360}$ s, $\frac{5}{360}$ s . . . , provided that the DC voltage converter has a B6 circuit and is operated with a supply frequency of 60 Hz. Consequently, fluctuations in the electric current which are caused due to the structure of the DC voltage converter and not due to an arc are smoothed, which avoids erroneous identification of arcs. Suitably, the length of the fourth time window is equal to the length of the fifth time window. If the DC voltage converter only has a single phase, the length of the fourth or fifth time window is equal to the reciprocal of twice the frequency, by means of which the DC voltage converter is supplied.

For example, the length of the third time window is selected to be equal to the length of the fourth time window. Alternatively, the length of the third time window is selected to be equal to the length of the fifth time window. Particularly preferred, the length of the third time window is selected to be equal to the length of the fourth time window and equal to the length of the fifth time window. In other words, the length of the fourth time window is equal to the length of the fifth time window. Because of such a selection, artifacts are avoided, and any arcing is detected relatively quickly and reliably. For example, between 1 millisecond and 65 milliseconds, for example 3 milliseconds, are used for the length of the third time window. Alternatively, 2 milliseconds are selected to be the length for the third time window.

The first limit value is selected to be, for example, greater than or equal to 15 volts. To maintain the arc, an electric voltage of at least 15 volts is required, so that, if the arc occurs and is connected in series to the battery system, the electric voltage increases by at least 15 volts. As a result, the arc is reliably detected if the electric voltage applied to the string increases by more than 15 volts. Particularly preferably, however, the first limit value is selected to be less than 12 volts. Alternatively, or particularly preferably in combination herewith, the first limit value is greater than 6 volts.

For example, the first limit value is between 10 volts and 8 volts. If the first value consequently increases by more than 6 volts, 8 volts, 10 volts or 12 volts within the first time window, the first condition is fulfilled. In choosing the first limit value in this way, faulty detection of the arc is essentially precluded due to the lower limit. The upper limit is selected to be less than the electric voltage required for the arc. In particular, if the electric voltage is averaged to obtain the first value, this way the arc is already relatively quickly detected after its occurrence. In addition, it is not necessary for the arc to be essentially continuous. In this way, also arcs are detected, for example, which occur periodically or erratically, for example due to a loose electrical connection of the battery systems with each other, or whose duration is shorter than the first and/or second time window.

For example, a second limit value is selected from the quotient of the first limit value and twice a system inductance. The system inductance is obtained, calculated or estimated, for example by means of measurement. The system inductance describes the inductance of the system used to charge the battery systems and is largely calculated in particular by a transformer, by means of which the DC voltage converter is supplied. In addition, to a lesser extent the system inductance is in particular dependent upon the string, i.e., the wiring and the battery systems. The system inductance is matched in particular to the DC voltage converter and/or the battery systems used and to their number. For example, the second limit value is greater or smaller than this quotient. If the second value consequently decreases in particular by more than the quotient, the second condition is fulfilled.

In particular, the length of the first time window is equal to the reciprocal of the product of twice the number of phases of the DC voltage converter and a supply frequency of the DC voltage converter. In other words, initially, twice the number of phases is calculated, by means of which the DC voltage converter is operated. For example, the DC voltage converter is connected to a three-phase AC mains. In this case, the number of phases equals three ("3"). Twice the number of phases corresponds in particular to the number of partial bridges of the DC voltage converter. If this has in particular a bridge circuit which is constructed, for example, as a B6 circuit and thus has six semiconductors, twice the number of phases equals six ("6"). If the DC voltage converter is connected to a single-phase AC mains, then twice equals two ("2").

The supply frequency is the frequency that each of the individual phases of the DC voltage converter has, for example 50 Hz or 60 Hz. For a three-phase DC voltage converter whose supply frequency is 60 Hz, the length of the first time window is therefore $1/360$ s, i.e. approx. 2.8 ms. In a three-phase DC voltage converter whose supply frequency is 50 Hz, the length of the first time window is thus $1/300$ s, or approx. 3.3 ms. In other words, it is checked as to whether the first value changes by more than the first limit value within 2.8 milliseconds or 3.3 milliseconds, and in particular whether it increases by more than the first limit value. Alternatively, in each case an integer multiple thereof is used. In other words, the length of the first time window corresponds to double, triple, quadruple, . . . the reciprocal. Thus, the length of the first time window is equal to a multiple of the reciprocal, that is, the simple, double, triple, . . . of the reciprocal.

Alternatively, or particularly preferably in combination therewith, the length of the second time window is equal to the reciprocal of the product of twice the number of phases of the DC voltage converter and a supply frequency of the DC voltage converter or an integral multiple thereof. In particular, the length of the second time window is thus $1/360$ s, $2/360$ s, $3/360$ s, $4/360$ s, $5/360$ s . . . , as long as the DC voltage converter has a B6 circuit and is operated with a supply frequency of 60 Hz.

If the DC voltage converter only has a single phase, the length of the first and second time window is equal to the reciprocal of twice the frequency, by means of which the DC voltage converter is supplied. The length of the first time window is preferably the same as the length of the second time window. Such a selection for the length of the first or the second time window allows for a relatively reliable detection of the arc because the changes in the electric voltage and the electric current follow one another comparatively promptly upon the occurrence of the arc. Here, however, comparatively short-term fluctuations, for example due to manufacturing tolerances of the DC voltage converter, are not identified incorrectly as arcs. The first and/or second time window is suitably calculated on the basis of a sampling frequency, in particular a frequency by means of which an A/D converter is operated. For example, the length of the first time window is an integral multiple of a time period corresponding to the sampling frequency.

Suitably, the arc is only detected if the electric voltage which is applied to the string prior to the third time window, within which both the first and second conditions occur, is greater than a third limit value. In other words, when both the first condition and the second condition exist within the third time window, it is checked as to whether the electric voltage was greater than the third limit value directly prior to this third time window. The third limit value is, for example, greater than 100 volts, greater than 120 volts and in particular less than 200 volts. For example, the third limit value is essentially equal to 150 volts. For example, the third limit value is between 50% and 75% of the product of the number of any cells of the string and 2 V. Alternatively, or in combination therewith, the arc is only detected if the electric current flowing through the string prior to the third window is greater than a fourth limit value, wherein within this third time window, both the first and the second conditions are met. Thus, it is checked as to whether directly prior to the third time window, within which both the first and the second conditions exist, the electric current flowing through the string is greater than a fourth limit value. The fourth limit value, for example, is dependent on the battery systems and/or is greater than 1 amp (A), 2 amps or 3 amps and, for example, less than 10 amps. For example, 5 amps is used as the fourth limit value. Alternatively, or more preferably in combination with the two preceding conditions, the arc is only recognized if during the third time window, during which the first and also the second condition is met, the electric current flowing through the string is greater than a fifth limit value. The fifth limit value is, for example, greater than 0.5 amps, 1 amp and, for example, less than 3 amps or 2 amps.

The additional conditions ensure that the battery systems are actually charged and that the system is already in a steady and/or stabilized state. In other words, the first and second conditions do not result, for example, from switch-on effects of the DC voltage converter or other components. Also, arcs occurring during start-up are not identified. When the battery systems are switched on or essentially shortly after they are switched on and charging begins, no explosive gases are formed yet, so that there is no risk of explosion. As an alternative to checking for the other conditions, for example, it can be checked as to whether the battery systems have already been charged for a certain period of time. This information is transferred, for example, by means of a cable, a conduit, a digital signal or a bus system. In this case, the arc is only recognized when the battery systems have been charged for a certain period of time, in particular for 10 seconds or 1 minute.

The method for manufacturing electric battery systems provides that initially, a number of uncharged battery systems are provided. For example, accumulators are used as battery systems, which are based on the electrochemical principle. In particular, rechargeable battery systems are provided that include an electrolyte. For the provision, for example, electrodes and an electrolyte are first placed mechanically in a housing. Lead acid batteries are particularly preferred as battery systems. In the uncharged lead acid batteries, substantially a number of electrodes which are made of lead and are suitably interconnected are arranged in a sulfuric acid solution.

The uncharged battery systems are electrically connected in series to form a string. For example, a cable or the like is placed on or attached to the poles of each battery system and in each case electrically contacted with a further pole of one of the other uncharged battery systems. The string is electrically contacted with a DC voltage converter, for example directly or particularly preferably via a cut-off device. In other words, the string is contacted with the cut-off device and the cut-off device is electrically contacted with the DC voltage converter. By means of the cut-off device, in particular the DC voltage converter is electrically isolated or at least electrically interrupted from the string. The connection of the uncharged battery systems to the string and the contacting with the DC voltage converter takes place, for example, in a single method step.

In a further method step, an electric voltage is applied to the string by means of the DC voltage converter and an electric current is created to flow through the string. For this purpose, the cut-off device is preferably controlled in a suitable manner. The electric voltage applied to the string is equal to the product of the number of battery systems and the charging voltage, which is required for one of the battery systems and is, for example, substantially equal to 400 volts. The electric current is in particular between 5 amps and 100 amps, between 10 amps and 90 amps and, for example, between 30 amps and 80 amps.

In addition, a method for detecting arcs during the charging of electric battery systems is performed. In this case, a first value corresponding to an electric voltage applied to the string is created. Further, a second value corresponding to an electric current flowing through the string is created. As a first condition, it is checked as to whether the first value changes by more than a first limit value within a first time window. In particular, it is checked as to whether the first value increases by more than the first limit value within the first time window. As a second condition, it is checked as to whether the second value changes by more than a second limit value within a second time window. Here, in particular it is checked as to whether the second value decreases by more than the second limit value. To determine the conditions, in particular, the derivative of the time course of the first and/or second value is calculated.

The arc is detected when the first condition and the second condition exist within a third time window. The length of the third time window is in particular essentially equal to 3 milliseconds or, for example, less, in particular equal to 2 milliseconds or 1 millisecond. In this way, the occurrence of an arc during the manufacture of the electric battery systems is known with relative certainty.

If, for example, a certain period of time has passed since the electric voltage was applied and the electric current flow was generated and/or if a certain electric current and/or a certain electric voltage is applied to the string, the battery systems are fully charged and thus generated. In this case, the current supply is preferably interrupted and/or the application of the electric voltage is interrupted. In addition, the interconnection of the battery systems is particularly removed. In other words, the string is disconnected again so that the individual battery systems are isolated. These are loaded and/or packaged, for example.

For example, after applying the electric voltage and establishing the electric current flow, initially the electric current is regulated to a certain value. After a certain period of time has elapsed, suitably regulation to a certain electric voltage takes place. The battery systems are preferably cooled during charging, that is to say as long as the electric voltage is applied to the string and/or as long as the electric current is flowing. To this end, the battery systems, for example, are subjected to cooling air. Alternatively, or in combination therewith, the battery systems are arranged, for example, in a cooling basin which is at least partially filled with a liquid, in particular with water.

Appropriately, the string is electrically isolated from the DC voltage converter, or at least electrically interrupted, when the arc is detected. In other words, the current supply to the string and thus charging of the battery systems is ended. The application of the electric voltage to the string is also ended. As a result, the arc breaks down and the plasma, which serves to maintain the arc, cools down. Therefore, there are no sparks in the vicinity of the strings, so that a potential explosive gas cloud, which might arise for example on account of the charge in particular due to a dissociation of water, cannot ignite.

The cut-off device is used for the electrical interruption (cut-off), for example isolation, of a string from a DC voltage source, in particular a DC voltage converter. The cut-off device is used in particular for the galvanic isolation of the string from the DC voltage converter. The string itself has a number of battery systems electrically connected in series, such as in particular lead acid batteries. The cut-off device includes an electric current sensor by means of which it possible to detect an electric current. Furthermore, the cut-off device has an electric voltage sensor by means of which an electric voltage is detected during operation. The cut-off device preferably has a switch, such as a relay, or a semiconductor switch, such as a power transistor, in particular a MOSFET, IGBT or thyristor. For example, the cut-off device has an interface to a bus system or the like. Also, the cut-off device comprises a control unit, which in particular is signally coupled to the electric current sensor and/or the electric voltage sensor. For example, the control unit comprises an A/D converter, by means of which an input signal of the current sensor or of the voltage sensor is converted into a digital word during operation. Appropriately, the switch and/or the interface is also coupled to the control unit, so that the former can be operated by means of the control unit. Here, the electric current sensor, the electric voltage sensor and the switch are conveniently arranged such that, if the cut-off device between the DC voltage converter and the string is electrically connected, an electric current flowing through the string during operation is detected by means of the electric current sensor. An electric voltage applied to the string is detected during operation by means of the electric voltage sensor. By means of the switch, it is possible to establish or to interrupt a current flow from the DC voltage converter to the string. By means of the interface, it is possible to output a control signal or a telegram, in particular to the bus system (data bus).

The control unit is operated in accordance with a method in which a first value corresponding to an electric voltage applied to the string is created. Further, a second value corresponding to an electric current flowing through the string is created. As a first condition, it is checked as to whether the first value changes by more than a first limit value within a first time window, and as a second condition, it is checked as to whether the second value changes by more than a second limit value within a second time window. An arc is detected if the first condition and the second condition are met within a third time window. If the arc is detected, the switch in particular is controlled such that the string is no longer electrically supplied by the DC voltage converter. In other words, the switch in particular is opened. Alternatively, or in combination, a control command or telegram is issued via the interface. The DC voltage converter is preferably switched off by means of the control command or the telegram. The control unit is suitable, in particular, provided and set up, to perform this method.

The developments and advantages performed in connection with the method for the detection of arcs when charging electric battery systems shall apply analogously to the method for manufacturing electric battery systems and/or the cut-off device as well as vice versa and with one another.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
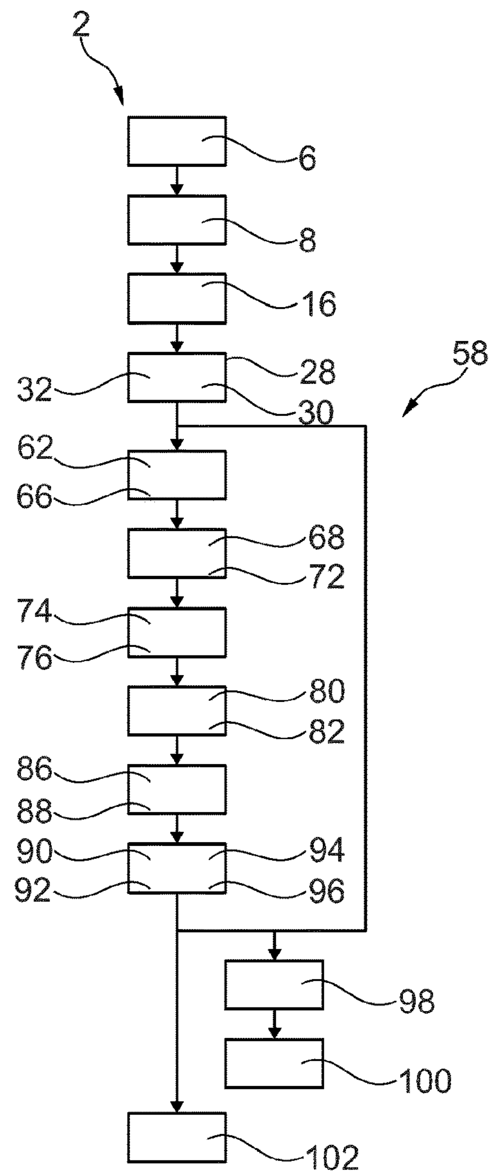
FIG. 1 illustrates a method for manufacturing electric battery systems with a method for the detection of arcs when charging electric battery systems.
Figure 2:
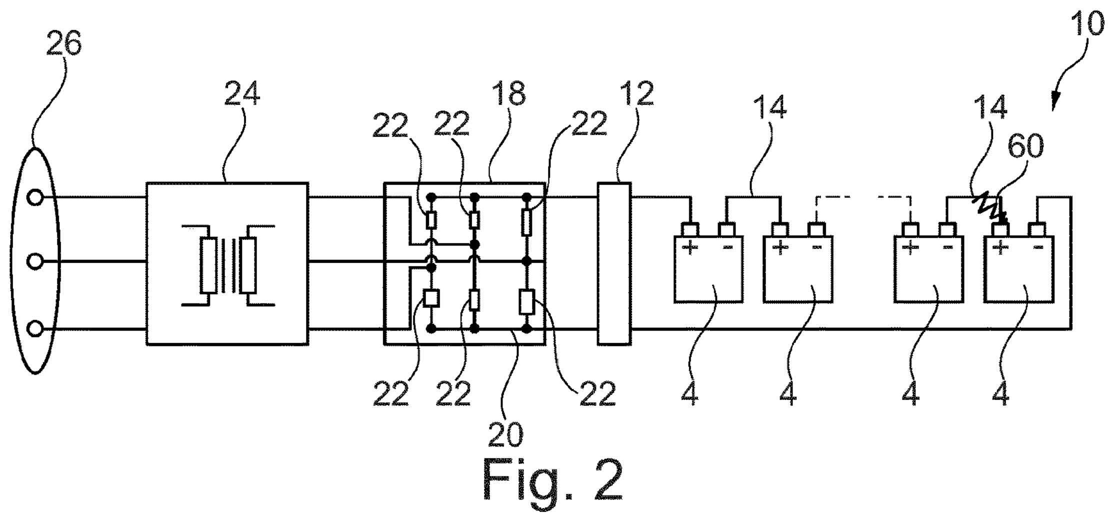
FIG. 2 illustrates schematically simplified, a number of battery systems which are electrically connected in series to form a string, which is supplied by means of a DC voltage converter.
Figure 3:
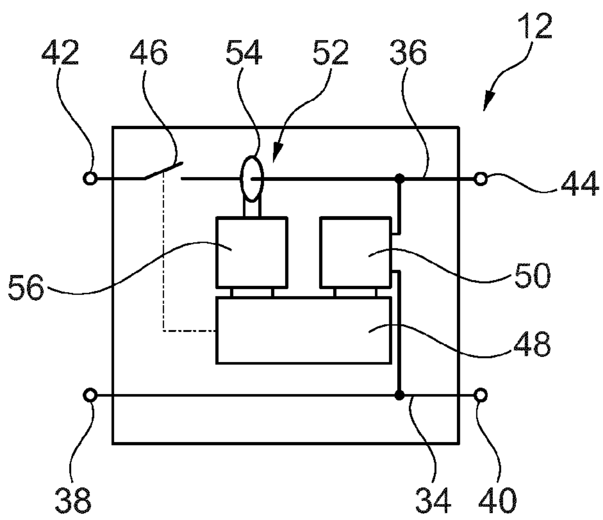
FIG. 3 illustrates a cut-off device for the electrical interruption of the string from the DC voltage converter.

FIG. 1 shows a method 2 for manufacturing electric battery systems 4 in the form of lead acid batteries. In a first step 6, the uncharged battery systems 4 are provided. In a second step 8, the uncharged battery systems 4 are connected together in series to form a string 10 and with a cut-off device 12, as shown in FIG. 2. Here, in each case a minus pole of one of the battery systems 4 is electrically connected with a positive pole of another of the battery systems 4 by means of a bridge 14 in the form of a cable to form the string 10. The two terminal ends of the string 10 are electrically contacted with the cut-off device 12.

In a third step 16, which takes place, for example, at the same time as the second step, or before or thereafter, the cut-off device 12 is electrically contacted with a DC voltage converter 18. The DC voltage converter 18 has a bridge circuit 20 with six semiconductor switches 22 in the form of MOSFETs or thyristors. Alternatively, the semiconductor switches 22 are line semiconductor diodes. The bridge circuit 20 is thus a B6 circuit and consequently has six partial bridges. The DC voltage converter 18 is supplied by means of a three-phase transformer 24, which is electrically contacted with a three-phase AC mains 26. The AC mains 26 thus has three phases, wherein each phase is sinusoidal and has a frequency of 60 Hertz.

In a fourth step 28, which takes place at a later time, an electric voltage 30 is applied to the cut-off device 12 and thus to the string 10 by means of the DC voltage converter 18. Furthermore, on the basis of the electric voltage 30, a flow of an electric current 32 is created via the cut-off device 12 and through the string 10. By means of the DC voltage converter 18, an electric voltage of 392 volts and an electric current flow of 50 amps are provided, wherein 28 battery systems 4 are provided. In addition, initially the desired electric current 32 is set. After a certain period of time, the electric voltage 30 is set.

The cut-off device 12 is schematically shown in simplified form in FIG. 2 and has an outgoing conductor 34 and a return conductor 36. The outgoing conductor 34 extends between a first terminal 38 and a second terminal 40 and is formed, for example, by means of a bus bar. In the assembled state, one of the terminals of the DC voltage converter 18 is electrically connected to the first terminal 38. In the assembled state, one of the terminals of the string 10 is connected to the second terminal 40. The return conductor 36 extends between a third terminal 42 and a fourth terminal 44, wherein in the assembled state, the remaining terminal of the DC voltage 18 is connected to the third terminal 42 and the remaining terminal of the string 10 is connected to the fourth terminal 44. A switch 46 in the form of a relay is introduced in the return conductor 36, so that by means of the switch 46, an electric current flow between the third terminal 42 and the fourth terminal 44 is interruptible. The switch 46 is signally connected to a control unit 48, so that the control unit 48 operates the switch 46.

The cut-off device 12 also has an electric voltage sensor 50, which includes an A/D converter. By means of the electric voltage sensor 50, an electric voltage applied between the second terminal 40 and the fourth terminal 44 is detected during operation and converted into a digital word, which is transmitted to the control unit 48. Here, during operation, the electric voltage is newly detected every 10 microseconds by means of the electric voltage sensor 50. Further, the cut-off device 12 has an electric current sensor 52 for measuring an electric current flowing between the third terminal 42 and the fourth terminal 44. The electric current sensor 52 includes a sensor probe 54. By means of the sensor probe 54, the electric current flowing on the return conductor 36 is detected. Moreover, the electric current sensor 52 has an A/D converter 56, by means of which the measured values of the sensor probe 54 are converted into a digital word and forwarded to the control unit 48. By means of the A/D converter 56, during operation a new digital word is created every 10 microseconds.

During the method 2 for the manufacturing of the electric battery systems 4, a method 58 for detecting arcs 60 is also performed, wherein the arc 60 for example is formed between a pole of one of the battery systems 4 and the associated bridge 14, for example, because the bridge 14 detaches from the associated pole due to faulty attachment. The method 58 for the detection of arcs 60 provides that in a fifth step 62, a first value 64 is generated using the electric voltage 30 applied to the string 10 and detected by means of the electric voltage sensor 50. To this end, a new value (measured value) of the electric voltage is recorded every 10 microseconds by means of the electric voltage sensor 50. These measured values are averaged over a fourth time window 66 and thus, the arithmetic mean of these measured values is created. The first value 64 is the time derivative of the course of the mean value of the electric voltage 30.

Figure 4:
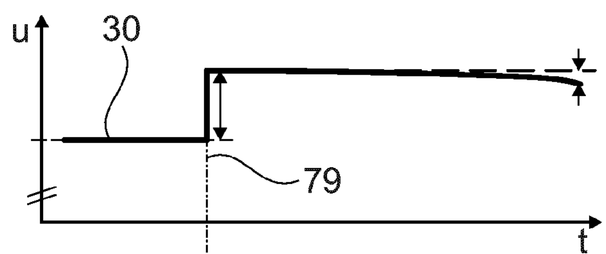
FIG. 4 illustrates a time course of an electric voltage applied to the string upon the occurrence of the arc.
Figure 6:
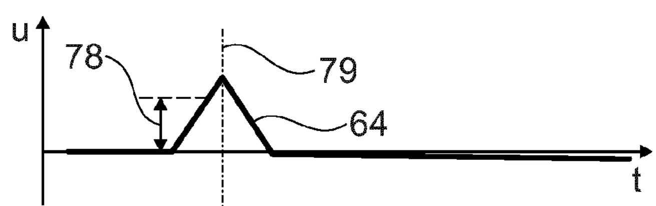
FIG. 6 illustrates a time course of a first value upon the occurrence of the arc.

The time course of the mean value of the electric voltage 30 is shown in FIG. 4 and the time course of the first value 64 is shown in FIG. 6. The length of the fourth time window 66 is equal to the reciprocal of the product of twice the number of phases of the DC voltage converter 18 and a supply frequency of the DC voltage converter 18. The number of phases of the DC voltage converter 18 is three and the supply frequency is 60 Hertz, so that approx. 270 measurement values contribute towards creating in each case one of the mean values and thus approx. 560 of one of the first values 64. For averaging, here, for example all measured values are again added, or an already calculated mean value is used and the oldest first value 64 is subtracted from this and the newest first value 64 is added.

Figure 5:
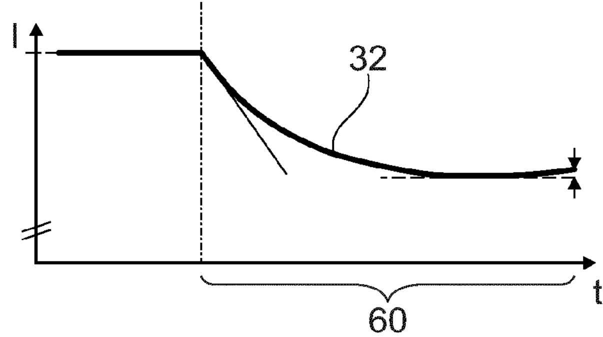
FIG. 5 illustrates a time course of an electric current flowing through the string upon the occurrence of the arc.
Figure 7:
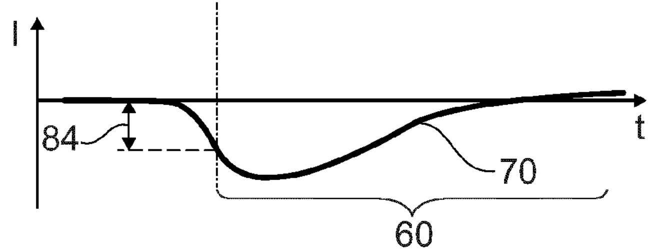
FIG. 7 illustrates a time course of a second value upon the occurrence of the arc.

In a sixth step 68, a second value 70 is calculated using the electric current 32 detected by means of the electric current sensor 52. For this purpose, first the arithmetic mean of the electric current 32 flowing through the string 10 is calculated via a fifth time window 72. The time course of the mean value of the electric current 32 is shown in FIG. 5. The second value 70 is the time derivative of the course of the mean value and is shown in FIG. 7. The length of the fifth time window 72 is constant and equal to the length of the fourth time window 66 and thus equal to the reciprocal of the product of twice the number of phases of the DC voltage converter 18 and the supply frequency of the DC voltage converter 18. Due to the selection of the length of the fourth and fifth time window 66, 72, an averaging occurs covering potential ripples in the electric voltage 30 and the electric current 32, which are caused due to the individual phases of the DC voltage converter 18, so that the mean value is substantially constant as long as the arc 60 does not occur.

The control unit 48 has two memories which operate according to the FIFO principle. The measured values of the electric current sensor 52 are stored in one of the memories, and the measured values of the electric voltage sensor 50 are stored in the other memory. Both memories are identical in construction and have a number of essentially 270 storage spaces. All measured values stored within the memory are used in this case to form the respective mean value of the electric voltage 30 or the electric current 32.

In a seventh step 74, it is checked as to whether the first value 64 changes by more than a first limit value 78 within a first time window 76. The first limit value 78 is selected to be less than 12 volts and greater than 6 volts and is equal to 8 volts. The length for the first time window 76 is selected to be 10 microseconds. Consequently, it is checked as to whether the first value 64 changes by more than the first limit value 78 within the time span which lies between a renewed calculation of the first value 64. If the arc 60 ignites at an ignition time 79, the electric voltage 30 rises by the value which is required to maintain the arc 90 connected in series to the battery systems 4. This electric voltage is at least 15 volts.

In an eighth step 80, it is checked as a second condition as to whether the second value 70 changes by more than a second limit value 84 within a second time window 82. The length of the second time window 82 is equal to the length of the first time window 76 and equal to 10 microseconds, so that each time when the second value 70 is newly calculated, it is checked as to whether this has changed by more than the second limit value 84. As a second limit value 84, the quotient from the first limit value 78, i.e., 10 volts and twice the system inductance, is used. In this case, the system inductance is dependent on the transformer 24 and the cable length of the bridges 14 and other cable lengths as well as the number of individual battery systems 4.

In a ninth step 86, it is checked as to whether the first condition and the second condition exist within a third time window 88. In other words, it is checked as to whether less than the length of the third time window 88 has passed between the change in the first value 74 by more than the first limit value 78 and the change in the second value 70 by more than the second limit value 84 within the respective time window 76, 82. The length of the third time window 88 is selected to be equal to the length of the fourth and fifth time windows 66, 72 and is therefore equal to 1/360 s.

If the first and the second condition are met, a check is performed in a tenth step 90 as to whether the electric voltage 30 applied to the string 10 was greater than a third limit value 92, which is 150 volts, prior to the third time window 88 within which both the first and the second condition are met. It is also checked as to whether the electric current 32 flowing through the string 10 prior to the third time window 88 within which both the first and second conditions are met is greater than a fourth limit value 94, which is 5 amperes. In addition, it is checked as to whether during the entire third time window 88 within which both the first as well as the second condition are met, the electric current 32 flowing through the string 10 is greater than a fifth limit value 96. As a fifth limit value 96, 2 amperes is used.

If these three further conditions and the first and also the second condition are met, the arc 60 is detected in an eleventh step 98. For example, a notification is output in this regard. In addition, a twelfth step 100 is subsequently carried out, in which the switch 46 is actuated and the string 10 is thus electrically isolated from the DC voltage converter 58. If the first and second conditions are either not met at all or do not exist within the third time window 88, no arc 60 is detected, and after a certain period of time depending on a characteristic curve specification and/or depending on an electric voltage/electric current provided/applied by the string 10, the energization of the string 10 is terminated by means of the DC voltage converter in a thirteenth step 102. In addition, the bridges 14 are detached and the now charged battery systems 4 removed. No (false) detection of the arc 60 takes place if the first and second conditions are met within the third time window 88, yet the electric voltage applied to the string prior to the third time window 88 was not greater than the third limit value, or the electric current 32 flowing through the string 10 prior to the third time window was not greater than the fourth limit value, or the electric current 32 flowing through the string 10 during the third time window 88 was not greater than the fifth limit value 96.

In summary, the charging of the individual battery systems 4 is interrupted when the arc 60 has been detected. This prevents any oxyhydrogen cloud that is created during charging from igniting. In addition, the individual bridges 14 and/or the individual poles of the battery systems 4 can be examined or replaced, where appropriate, after detection of the arc 60. Also, a re-attachment of the bridges 14 is made possible. Here, the electric current sensor 52 and the electric voltage sensor 50 of the cut-off device 12 are used, wherein the analog measured data is in each case converted into a digital word by means of the respective A/D converters 56. By means of the control unit 48, in particular typical characteristics of arcs 60 are identified. If the arc fault 60 has been identified, the switch 46 is actuated so that the string 10 is electrically isolated from the DC voltage converter 18.

By means of the averaging over the fourth and fifth time window 66, 72, high-frequency elements are filtered out, which arise in particular due to the actuation of the semiconductor elements 22. In other words, smoothing takes place. Here, the length of the fourth and fifth time windows 76,72 is selected such that at least in each case 20 measured values are used to calculate the first and second value 64, 70, so that sufficient accuracy is achieved.

Due to the relatively high battery capacity, the electric voltage 30 increases with the occurrence of the arc 60 by at least 15 volts, whereas the electric current 32 exponentially decreases, wherein the exponent is initially equal to the negative quotient of the initial voltage of the arc 60 and the system inductance. After a certain period of time, these effects subside due to a discharge of the individual battery systems 4 and the readjustment.

As a first condition, it is checked as to whether the first value 64 changes within the first time window 46 by more than the first limit value 78. On the basis of the averaging, this corresponds to checking as to whether the difference between the moving average coming from the right and the moving average coming from the left is above the first limit value 78. Further, it is checked as the second condition as to whether the second value 70 changes within the second time window 82 by more than the second limit value 84, that is, as to whether the difference between the moving average of the electric current 32 calculated from the left and from the right is greater than the second limit value 84, wherein, for example, the negative quotient from the first limit value 78 and twice the system inductance is selected as the second limit value 84.

It is also checked as to whether the first condition occurs essentially at the same time as the second condition or at least within the third time window 88, wherein only the arc 60 is recognized, for example, if the two conditions exist within the third time window 88. For example, it is additionally checked as to whether the second condition occurs only after the first condition. Otherwise, the arc 60 has not been detected. Further, it is checked in the tenth step 90 as to whether the electric voltage 30 was greater than the third limit value 92 prior to the anticipated time of the arc, and whether the minimum electric current 32 was greater than the fourth limit value immediately prior to the anticipated arc 60. It is also checked as to whether the flowing electric current 32 is greater than the fifth limit value during the anticipated arc 60. In this way, erroneous detection of the arc 60 during the start of an energization, i.e., when switching on the transformer 24 and/or the DC voltage converter 18, is avoided.

The invention is not limited to the embodiment described above. Rather, other variants of the invention can be derived by those skilled in the art without departing from the subject matter of the invention. In particular, all of the individual features described in connection with the exemplary embodiment can also be combined with one another in other ways without departing from the subject matter of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for detecting arcs when charging electric battery systems, in particular lead acid batteries, which are electrically connected in series to form a string, which is supplied via a DC voltage converter, the method comprising:
- generating a first value corresponding to an electric voltage applied to the string;
- generating a second value corresponding to an electric current flowing through the string;
- checking, as a first condition, whether the first value changes by more than a first limit value within a first time window;
- checking, as a second condition, whether the second value changes by more than a second limit value within a second time window;
- detecting an arc when the first condition and the second condition are met within a third time window; and
- isolating the string from the DC voltage converter when the arc has been detected.

2. The method according to claim 1, wherein the first value is generated by averaging the electric voltage applied to the string over a fourth time window, and/or wherein the second value is generated by averaging the electric current flowing through the string over a fifth time window.

3. The method according to claim 2, wherein the length of the fourth or fifth time window is selected to be constant and corresponds to the reciprocal of the product of twice the number of phases of the DC voltage converter and a supply frequency of the DC voltage converter or an integer multiple thereof.

4. The method according to claim 2, wherein the length of the third time window is selected to be equal to the length of the fourth or fifth time window.

5. The method according to claim 1, wherein the first limit value is selected to be less than 12 V and/or greater than 6 V.

6. The method according to claim 1, wherein the second limit value is selected to be equal to the quotient of the first limit value and twice a system inductance.

7. The method according to claim 1, wherein the length of the first and/or second time window is selected to be constant and corresponds to the reciprocal of the product of twice the number of phases of the DC voltage converter and a supply frequency of the DC voltage converter or an integer multiple thereof.

8. The method according to claim 1, wherein the arc is only detected:
- if the electric voltage applied to the string prior to the third time window is greater than a third limit value;
- if the electric current flowing through the string prior to the third time window is greater than a fourth limit value; and/or
- if the electric current flowing through the string during the third time window is greater than a fifth limit value.

9. The method according to claim 1, further comprising indicating to a user that the arc has been detected to allow the user to isolate the string from the DC voltage converter.

10. A method for manufacturing electric battery systems, in particular lead acid batteries, the method comprising:

providing at least two uncharged battery systems;

connecting in series the uncharged battery systems to form a string;

electrically contacting the string with a DC voltage converter;

applying, via the DC voltage converter, an electric voltage to the string and an electric current flow is created through the string; and performing a detection of an arc according to claim 1.

11. The method according to claim 10, wherein the string is electrically isolated from the DC voltage converter when the arc is detected.

12. A cut-off device for the electrical interruption of a string, which has a number of battery systems electrically connected in series, from a direct voltage source or a DC voltage converter, the cut-off device comprising:

an electric current sensor; and an electric voltage sensor; and a control unit, which is operated according to the method according to claim 1.

* * * * *